(12) United States Patent
Chao

(10) Patent No.: US 11,245,412 B2
(45) Date of Patent: Feb. 8, 2022

(54) SAR ADC USING VALUE SHIFTED CAPACITIVE DAC FOR IMPROVED REFERENCE SETTLING AND HIGHER CONVERSION RATE

(71) Applicant: IPGREAT INCORPORATED, Grand Cayman (KY)

(72) Inventor: Yuan-Ju Chao, Cupertino, CA (US)

(73) Assignee: IPGreat Incorporated

( * ) Notice: Subject to any disclaimer, the term of this patent is extended or adjusted under 35 U.S.C. 154(b) by 0 days.

(21) Appl. No.: 16/159,953

(22) Filed: Oct. 15, 2018

(65) Prior Publication Data

US 2020/0119745 A1    Apr. 16, 2020

(51) Int. Cl.
*H03M 1/38*    (2006.01)
*H03M 1/46*    (2006.01)

(52) U.S. Cl.
CPC .................................. *H03M 1/466* (2013.01)

(58) Field of Classification Search
CPC ........... H03M 1/466; H03M 1/12; H03M 1/00

USPC ........................................ 341/155, 161, 144
See application file for complete search history.

(56) References Cited

U.S. PATENT DOCUMENTS

| | | | | |
|---|---|---|---|---|
| 9,425,814 | B1* | 8/2016 | Verma | H03M 7/165 |
| 9,654,130 | B2* | 5/2017 | Venca | H03M 1/667 |
| 9,654,132 | B2* | 5/2017 | Venca | H03M 1/667 |
| 2017/0250702 | A1* | 8/2017 | Venca | H03M 1/667 |

\* cited by examiner

*Primary Examiner* — Jean B Jeanglaude
(74) *Attorney, Agent, or Firm* — Patent PC; Bao Tran

(57) ABSTRACT

A method of enhancing SAR ADC conversion rate by employing a new value shifted capacitor DAC. The value shifted capacitor DAC decreases largest capacitor to improve the reference voltage settling. The reduction of capacitor is added back onto the smaller capacitor DAC to maintain the same total capacitor value. The binary search outputs are re-combined and processed to produce final binary ADC outputs. The overhead of using value shifted capacitor DAC is the extra latency needed for re-combined logic.

20 Claims, 9 Drawing Sheets

SAR ADC USING VALUE SHIFTED CAPACITIVE DAC FOR IMPROVED REFERENCE SETTLING AND HIGHER CONVERSION RATE

BACKGROUND

The present invention relates to data converters.

FIG. 1 shows the block diagram of a Successive Approximation Register Analog-Digital Converter (SAR ADC) with the elements of Track/Hold, Comparator, N-bit DAC and Binary Search Logic. The analog input voltage ($V_{IN}$) is sampled and held by Track/Hold. The Binary Search Logic is initially set to midscale (100 . . . 00). This forces the DAC output ($V_{DAC}$) to be $V_{REF}/2$, where $V_{REF}$ is the reference voltage of ADC. The Comparator compares $V_{IN}$ and $V_{DAC}$ and determines the next operation based on the comparator result. If $V_{IN}$ is greater than $V_{DAC}$, the comparator output is logic high and the MSB of N-bit register remains at 1. Conversely, if $V_{IN}$ is less than $V_{DAC}$, the comparator output is logic low and the MSB is cleared to logic 0. This binary-search algorithm continues to the next MSB-1 bit. The conversion is complete once LSB output is obtained.

Capacitive DAC is often used to implement N-bit DAC owing to its inherent track/hold function. A capacitive DAC consists of an array of N capacitors with binary or non-binary weighted values. Capacitive DAC employs the principle of charge redistribution to generate an analog output voltages during the binary search process. FIG. 2 shows an example of a 14-bit capacitive binary weighted DAC and comparator in SAR ADC. During the sample phase, all the switches are connected to the input $V_{IN}$. The $V_{IN}$ voltage is effectively sampled and stored on the capacitors. As the first step of binary-search algorithm begins, the bottom plate of MSB capacitor is connected to reference voltage $V_{REF}$. This drives the voltage of comparator inputs by an amount of $1/2 V_{REF}$. The comparator decides and stores the comparator output value. As the binary-search algorithm continues, the next smaller capacitor is connected to $V_{REF}$. The conversion is complete once all the DAC capacitors are exercised. The relationship of $V_{IN}$ and ADC digital output is described by the equation:

$$V_{IN} = B13 * \frac{V_{REF}}{2} + B12 * \frac{V_{REF}}{4} + \ldots + B1 * \frac{V_{REF}}{8192} + B0 * \frac{V_{REF}}{16384}$$

$V_{IN}$ is the ADC input voltage
B[13: 0] is ADC outputs
$V_{REF}$ is ADC reference voltage FIG. 3 shows the exemplary timing diagram of 14-bit SAR ADC. Track/hold takes 6 clock cycles to sample the input and 14 clock cycles is required for 14 bit-tests. It takes 20 clock cycles to complete one conversion. FIG. 4 illustrates the DAC output and reference $V_{REF}$ settling response during the bit tests. Reference voltage $V_{REF}$ is disturbed when DAC inputs change and it needs to recover before the next DAC input changes. The DAC is changing for each bit-test clock Tclock. Reference voltage $V_{REF}$ drops to a lower voltage when it is charging the capacitors. The largest voltage drop happens at MSB bit-test since MSB capacitor has the largest capacitor value. If $V_{REF}$ does not recover to its presumed value when the next DAC input changes, the reference value is incorrect and this leads to inaccurate DAC outputs and erroneous ADC outputs. As shown in FIG. 4, $V_{REF}$ reference voltage fails to reach its initial value during MSB change and barely return to its initial value for MSB-1 change. In this case, the clock cycle time has to be increased to allow reference voltage to settle and this results in a lower ADC conversion rate.

SUMMARY

A Successive Approximation Register Analog-Digital Converter (SAR ADC), includes a value shifted capacitor DAC; and a bit re-combiner circuit coupled to the value shifted capacitor DAC to improve reference voltage settling of the SAR ADC. Implementations of the SAR ADC can include one or more of the following. The capacitor DAC comprises most significant bit (MSB) and MSB-1 capacitors and wherein the capacitor values are decreased to be non-binary weighted format. The capacitor DAC comprises MSB and MSB-1 capacitors and wherein a reduction of MSB and MSB-1 capacitor value is distributed and added back onto lower bit capacitors to maintain the same total capacitor DAC value. The capacitor DAC comprises MSB and MSB-1 capacitors and wherein two extra capacitors are added after LSB capacitor and the reduction of MSB and MSB-1 capacitor value is re-distributed onto lower bit capacitors. Two or more extra capacitors are added after an LSB capacitor while maintaining the same total capacitor value to enhance the reference accuracy tolerance and allow errors during SAR binary search process. The capacitor DAC resolution is increased to introduce redundancy and relax a reference accuracy requirement for achieving higher ADC conversion rate. The bits re-combiner logic combines binary search logic outputs and processed to produce final binary outputs of the SAR ADC. The bits re-combiner logic combines resolution outputs of a binary search logic are combined and converted to lower resolution binary outputs of ADC. Extra bits are used that introduces redundancy and increases the tolerance of reference accuracy and reduces error during a binary search. A circuit for shifting and re-distributing the MSB and MSB-1 capacitors to lower bit capacitors to decrease the largest capacitance of the SAR DAC and an associated time constant.

In another aspect, a method to perform Successive Approximation data conversion includes shifting and redistributing a most significant bit (MSB) capacitor of binary weighted DAC to lower bit capacitors DAC to improve reference settling and enhance SAR ADC conversion rate.

Advantages of the system may include one or more of the following. The DAC system improves the reference settling by shifting MSB capacitor to lower bit capacitors while maintaining the total number of capacitor value. The system addresses unsettled reference voltage bottleneck of the SAR ADC conversion rate. The reference voltage endures the largest voltage drop during the switch toggling of MSB capacitor. By employing a proposed value shifted capacitor DAC, the MSB capacitance is decreased and the reference settling is improved. The shifted capacitor DAC method reduces MSB capacitors and distributes the deduction of capacitor values to lower bit capacitors. Extra bits capacitors are added after LSB capacitors to enhance the tolerance of reference voltage error. Binary search logic outputs are delivered into bits re-combiner logic and processed to provide the final binary outputs of ADC. The overhead expense of employing shifted capacitor DAC is the latency of bit re-combiner logic. Implementations of the above aspect can include one or more of the following: a value shifted capacitor DAC and a bits re-combiner logic.

A more complete appreciation of the present invention and its improvements can be obtained by reference to the

DETAILED DESCRIPTION

Figure 1:
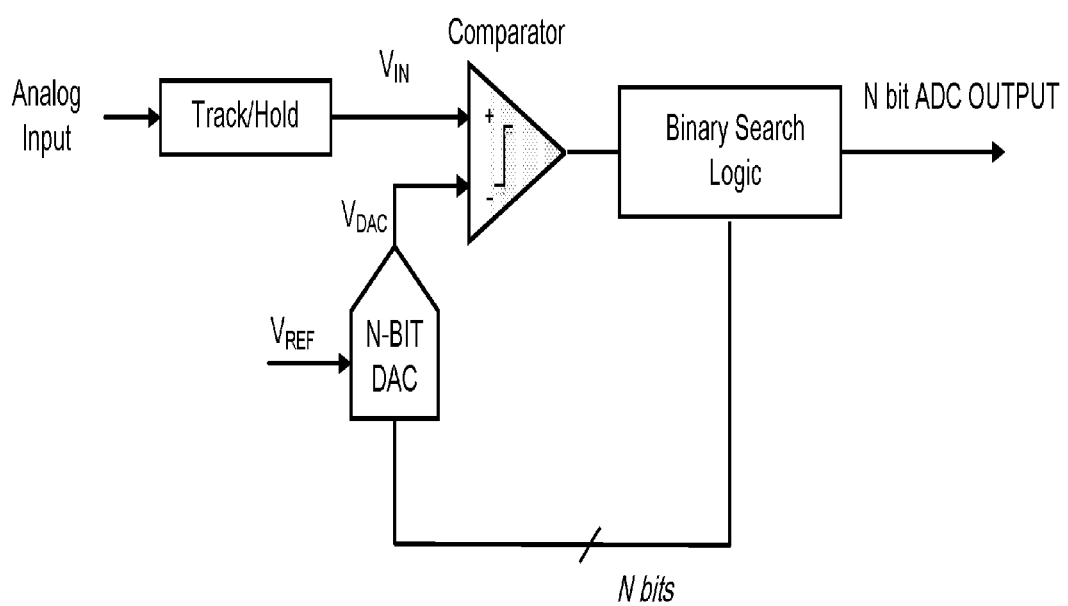
FIG. 1 shows a N-bit SAR ADC block diagram
Figure 2:
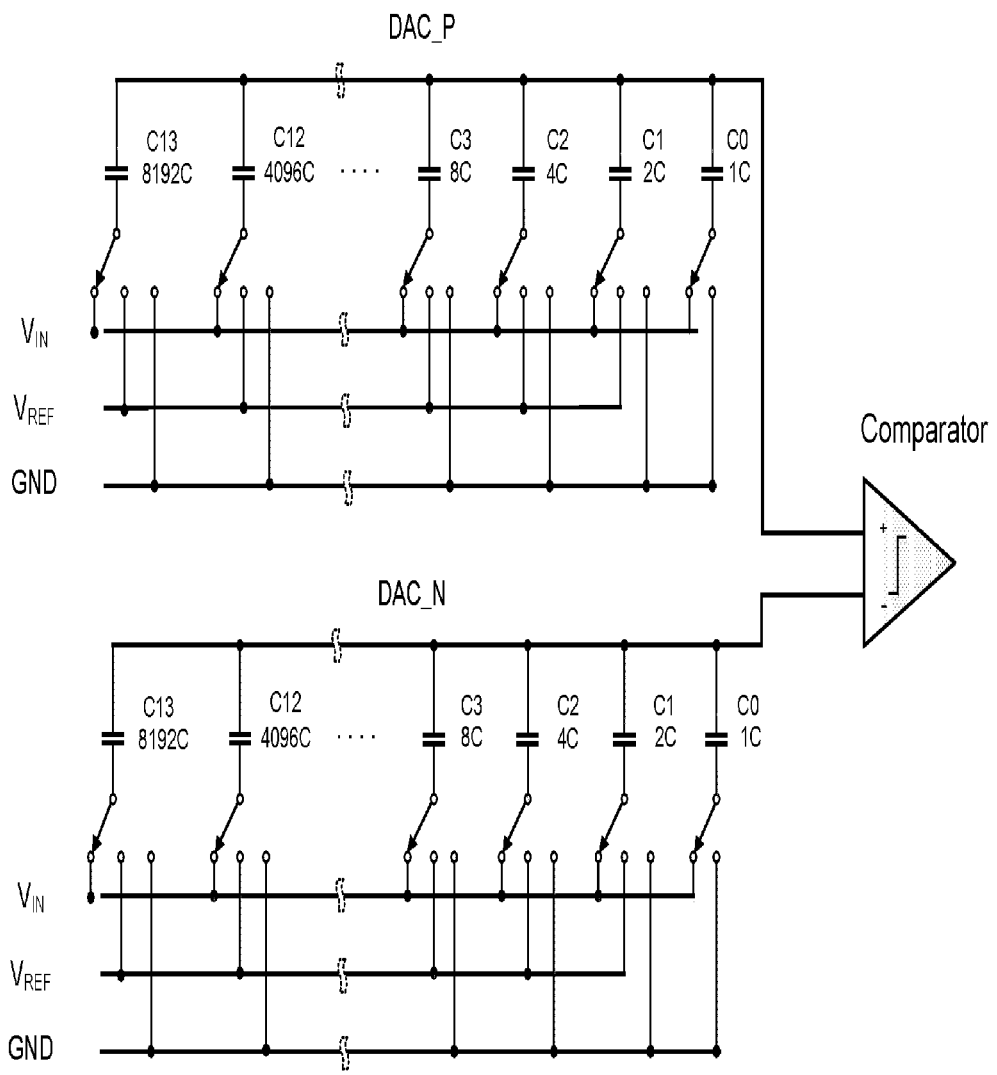
FIG. 2 illustrates a 14-bit capacitive DAC in SAR ADC
Figure 3:
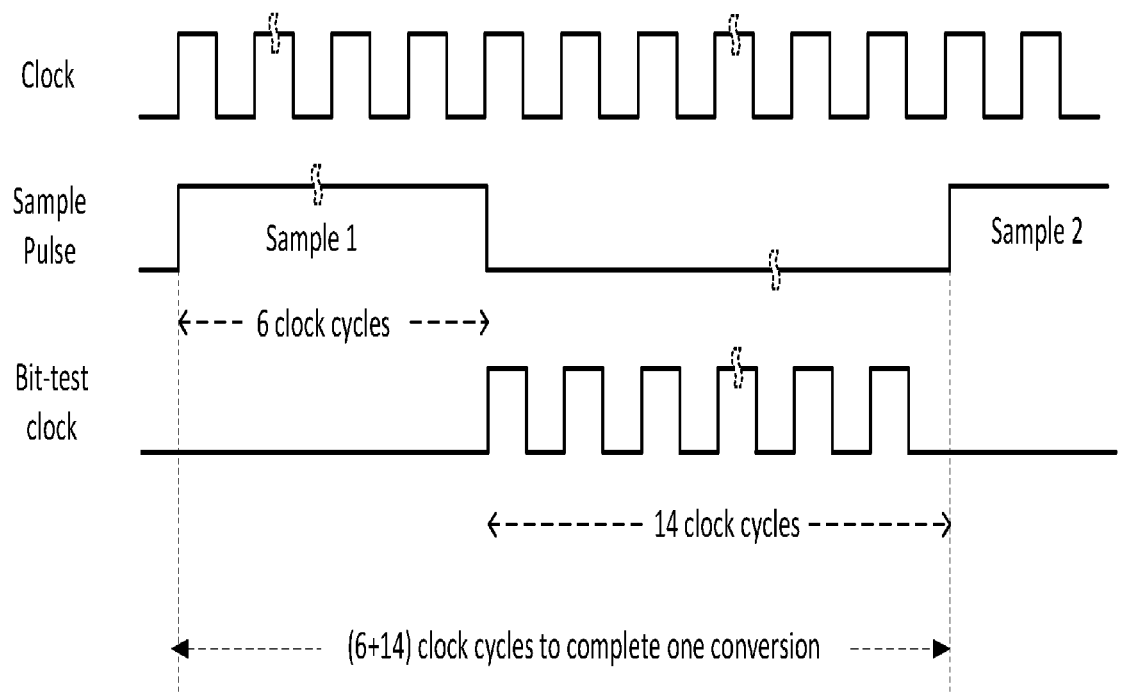
FIG. 3 illustrates the clock and timing diagram of 14-bit SAR ADC
Figure 4:
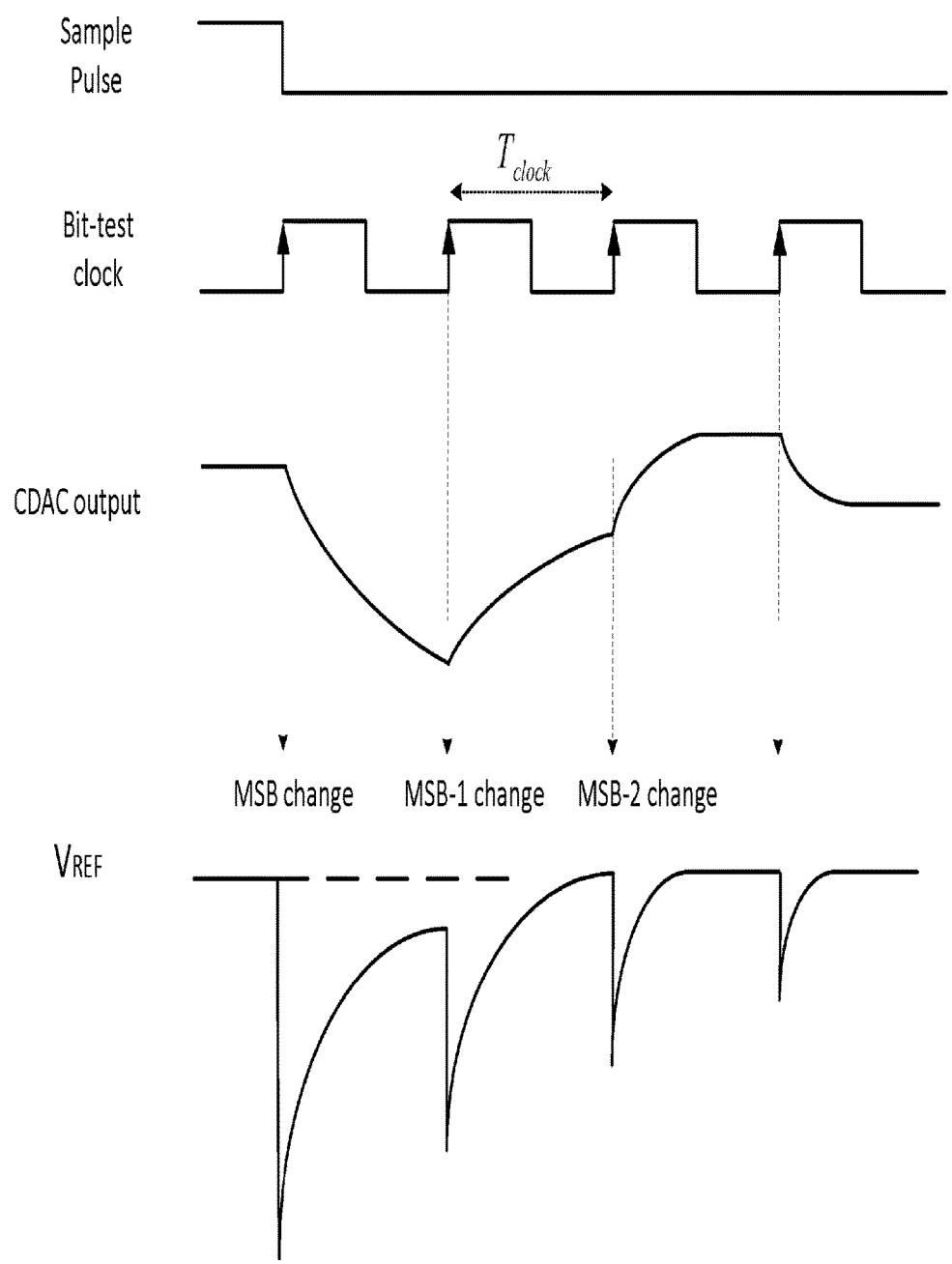
FIG. 4 shows the reference voltage settling of SAR ADC during binary search bit-test

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Figure 5:
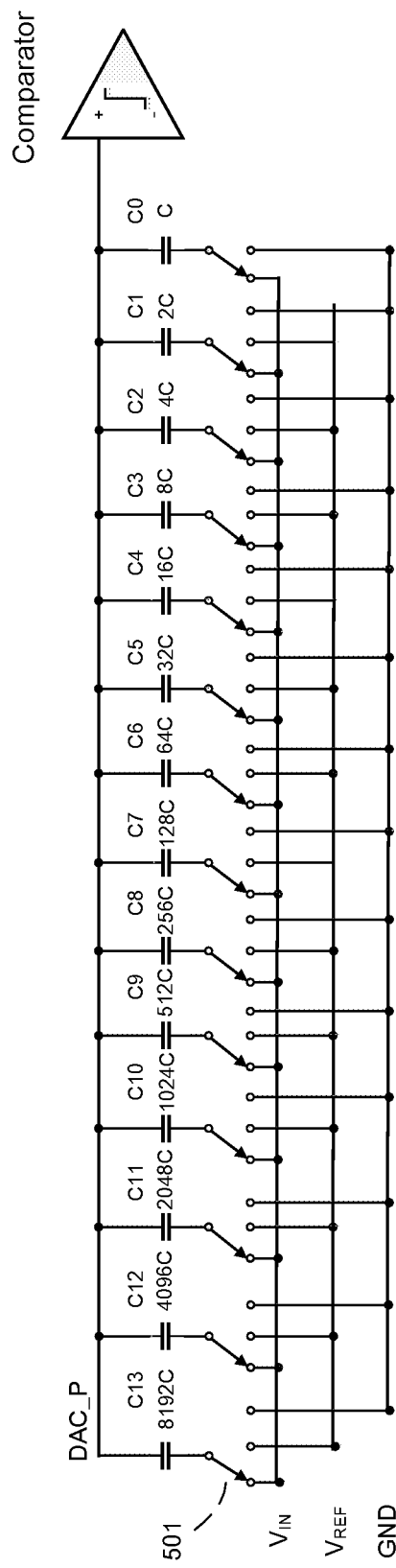
FIG. 5 is the conventional capacitor DAC value of 14-bit SAR ADC

FIG. 5 shows the conventional binary weighted capacitor DAC implementation of 14-bit SAR ADC. There are 14 binary weighted capacitors and 14 associated switches. The capacitor value doubles for each upper bit from LSB C0 to MSB C13. MSB capacitor C13, C12 and C11 has 8192C, 4096C and 2048C respectively. LSB capacitor C0 is 1C. There are 16384C capacitors in total for 14-bit binary weighted DAC. When DAC input switch 501 change from GND to REF, MSB capacitor C13 is charged. On the other hand, MSB capacitor C13 is discharged when switch 501 changes from REF to GND. Since MSB capacitor is the largest capacitor among 14 capacitors, the settling of MSB capacitor takes the longest time due to large time constant. Time constant is expressed as the switch resistance multiplies the capacitor value.

Figure 6:
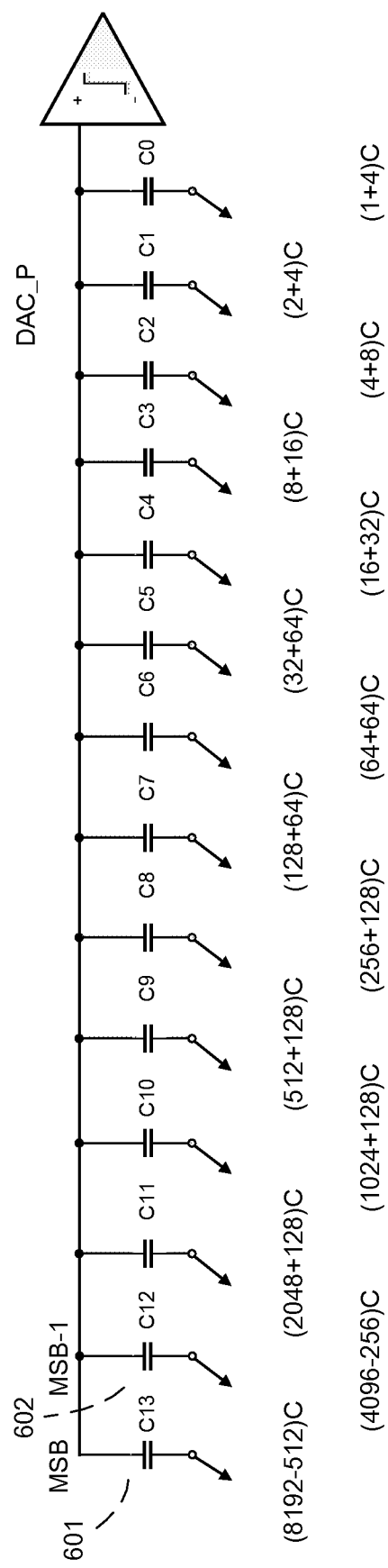
FIG. 6 is the proposed value shifted DAC implementation of SAR ADC

FIG. 6 illustrates the proposed shifted capacitor DAC implementation of 14-bit SAR ADC. The connections of switches are omitted for simplification. The number of capacitors and switches are the same as FIG. 5 but the capacitor values are modified to improve the reference settling. MSB capacitor 601 is reduced by 512C and MSB-1 capacitor 602 is reduced by 256C. The total reduction of C13 and C12 capacitors is 512C+256C=768C. The reduced capacitors are shifted and added back onto the lower bits capacitors. Capacitors C11, C10, C9 and C8 are increased by 128C. Capacitor C7, C6 and C5 are increased by 64C. Capacitor C4, C3, C2, C1 and C0 are increased by 32C, 16C, 8C, 4C and 4C respectively. The total increased capacitor value are 128*4+64*3+32+16+8+4+4=768C which is the same as the reduction capacitor value of C13 and C12. By shifting the MSB and MSB-1 capacitance to lower bit capacitance, the reference voltage settling of MSB and MSB-1 capacitor is greatly improved during SAR ADC binary search bit-test.

Figure 7:
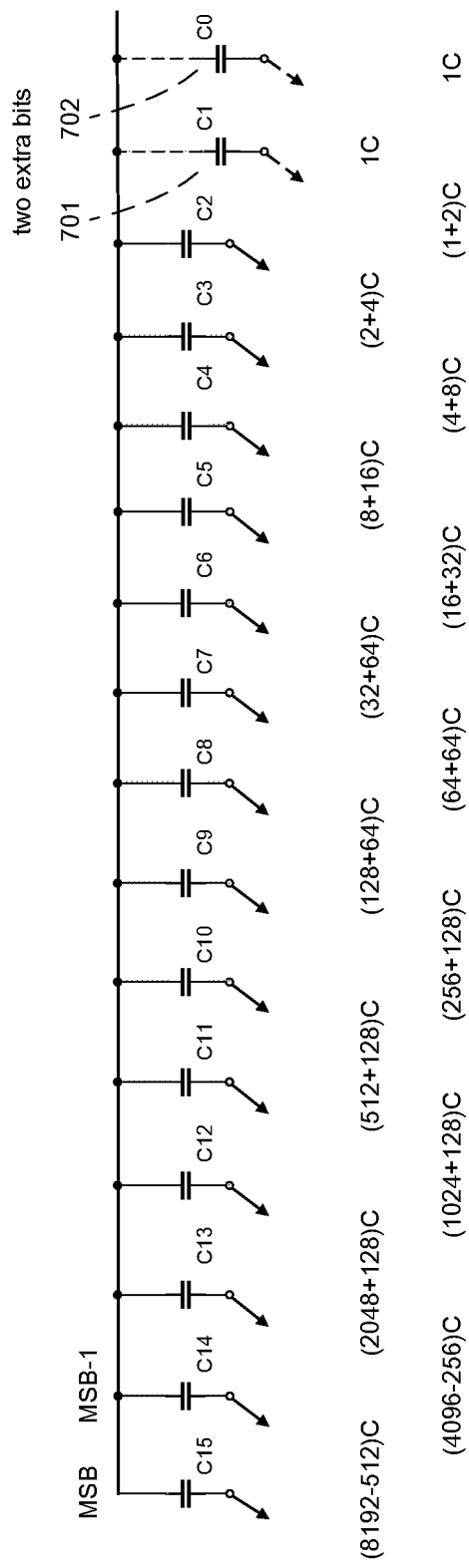
FIG. 7 is the proposed value shifted DAC implementation with two extra bits added

FIG. 7 shows another shifted capacitor DAC implementation of 14-bit SAR ADC. Two extra bits are added after LSB capacitor such that 14-bit DAC is expanded to 16-bit capacitor DAC. Adding extra two bits introduces redundancy and increases the tolerance of reference accuracy and allows small error during binary search. Similar to FIG. 6, the reduced MSB and MSB-1 capacitance is added and distributed onto lower bit capacitors. The sum of 16 capacitors from C0 and C15 is 16384C, which is the same as the total number of capacitors on FIG. 5 and FIG. 6. The re-distribution of capacitors number decreases the MSB and MSB-1 capacitors and enhances the reference settling owing to smaller time constant. Since the value shifted capacitor DAC is not in binary format, the binary search logic outputs need to be re-combined and processed to produce the final binary ADC outputs.

Figure 8:
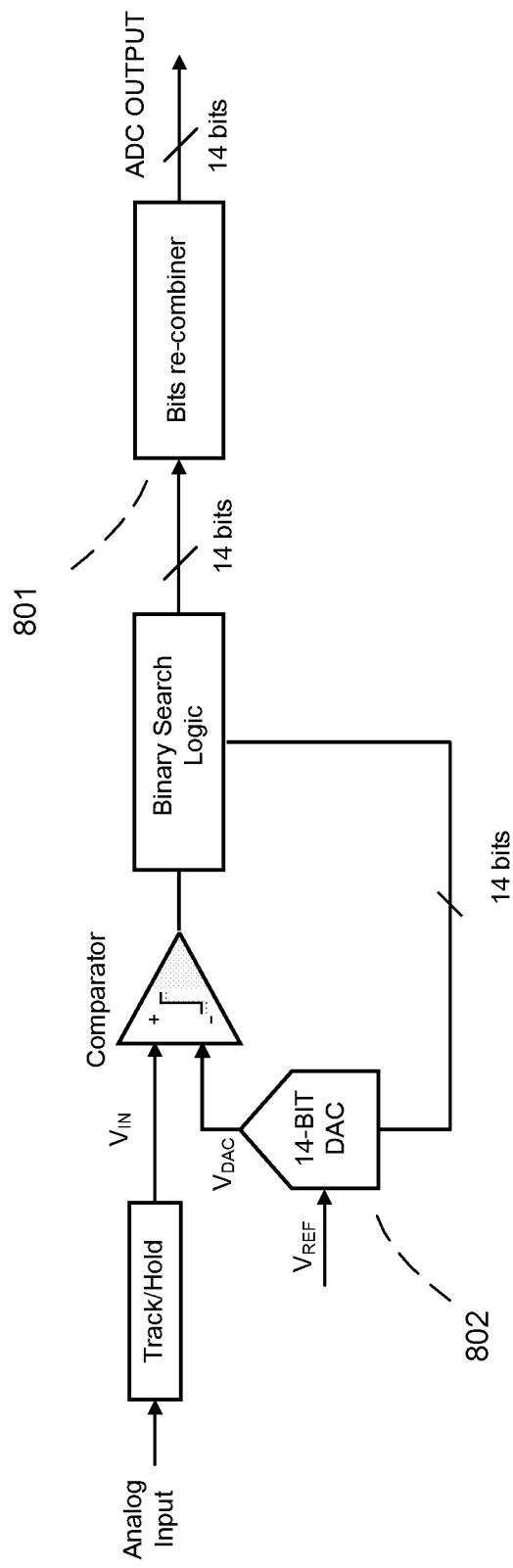
FIG. 8 shows the overall diagram of proposed SAR ADC using value shifted DAC
Figure 9:
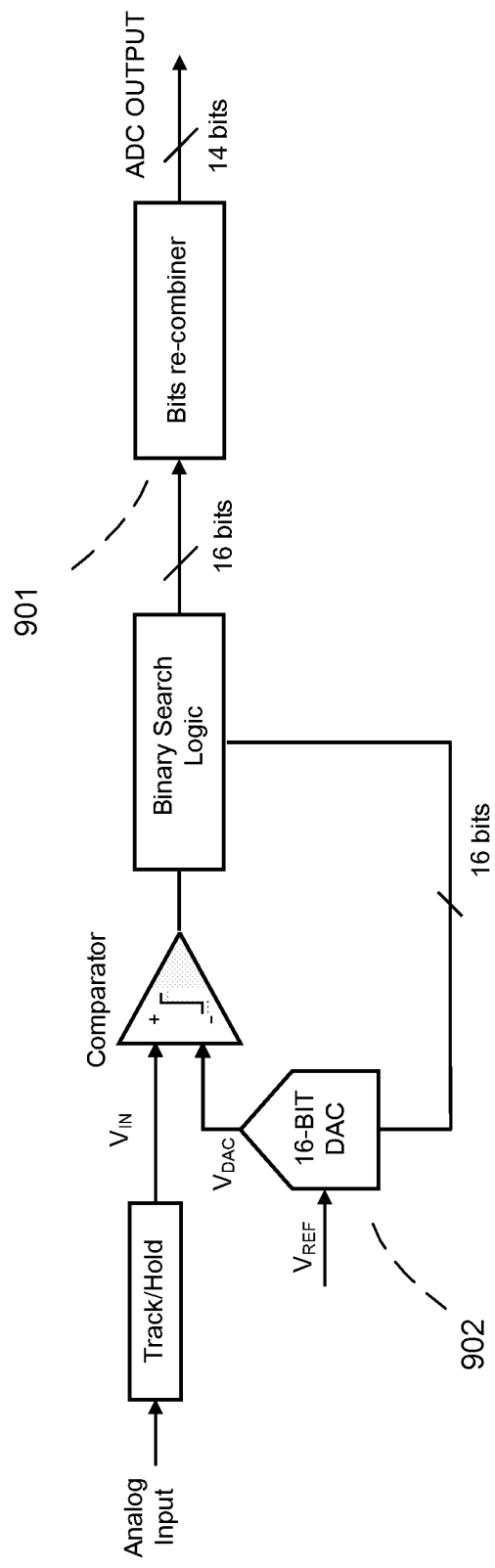
FIG. 9 is the diagram of SAR ADC using value shifted DAC with two extra bits added

FIG. 8 shows the functional diagram of 14-bit SAR ADC using value shifted capacitor DAC structure. The 14-bit outputs of the binary search logic are coupled to bits re-combiner 801 and processed to generate final 14-bit ADC binary outputs. Since 14-bit DAC 802 is not binary weighted, bits re-combiner logic is required to convert non-binary outputs to final binary outputs. FIG. 9 shows the functional diagram of 14-bit SAR ADC using value shifted capacitor DAC with added two extra bits. The capacitor DAC is expanded to 16-bit capacitor DAC 902 with the extra 2 bits added after LSB capacitor. Binary search logic needs two extra clock cycles to finish one conversion compared with FIG. 8. The 16-bit outputs of binary search logic are delivered to bits re-combiner 901 and processed then converted to final 14-bit ADC binary outputs. The overhead expense of the proposed value shifted capacitor structure is the extra logic latency of bits re-combiner.

Since the worst scenario of reference settling of SAR ADC happens at the MSB capacitor toggling, by shifting and re-distributing the MSB and MSB-1 capacitors to lower bit capacitors, the largest capacitance of DAC is decreased and the associated time constant is reduced. With the smaller time constant, the reference voltage can respond quicker and recover to its presumed value in a shorter time. This results in a higher SAR ADC conversion rate. Besides, with added two extra bits, the tolerance of reference accuracy is increased due to redundancy. Small reference error does not contribute to conversion error and hence the sampling clock rate can be increased to boost the ADC conversion rate.

What is claimed is:

1. A Successive Approximation Register Analog-Digital Converter (SAR ADC), comprising:
   a value shifted capacitor DAC;
   a bit re-combiner circuit coupled to the value shifted capacitor DAC to improve reference voltage settling of the SAR ADC.

2. The SAR ADC of claim 1, wherein the capacitor DAC comprises most significant bit (MSB) and MSB-1 capacitors and wherein the capacitor values are decreased to be non-binary weighted format.

3. The SAR ADC of claim 1, wherein the capacitor DAC comprises MSB and MSB-1 capacitors and wherein a reduction of MSB and MSB-1 capacitor value is distributed and added back onto lower bit capacitors to maintain the same total capacitor DAC value.

4. The SAR ADC of claim 1, wherein the capacitor DAC comprises MSB and MSB-1 capacitors and wherein two extra capacitors are added after LSB capacitor and the reduction of MSB and MSB-1 capacitor value is re-distributed onto lower bit capacitors.

5. The SAR ADC of claim 1, wherein two or more extra capacitors are added after an LSB capacitor while maintaining the same total capacitor value to enhance the reference accuracy tolerance and allow errors during SAR binary search process.

6. The SAR ADC of claim 1, wherein a capacitor DAC resolution is increased to introduce redundancy and relax a reference accuracy requirement for achieving higher ADC conversion rate.

7. The SAR ADC of claim 1, wherein the bits re-combiner logic combines binary search logic outputs and processed to produce final binary outputs of the SAR ADC.

8. The SAR ADC of claim 1, wherein the bits re-combiner logic combines resolution outputs of a binary search logic are combined and converted to lower resolution binary outputs of ADC.

9. The SAR ADC of claim 1, comprising extra bits that introduces redundancy and increases the tolerance of reference accuracy and reduces error during a binary search.

10. The SAR ADC of claim 1, comprising a circuit for shifting and re-distributing the MSB and MSB-1 capacitors to lower bit capacitors to decrease the largest capacitance of the SAR DAC and an associated time constant.

11. A method to perform Successive Approximation data conversion, comprising:
    shifting and redistributing a most significant bit (MSB) capacitor of binary weighted DAC to lower bit capacitors DAC to improve reference settling and enhance SAR ADC conversion rate.

12. The method of claim 11, comprising shifting MSB capacitor of binary weighted DAC to lower bit capacitors and adding two extra bit capacitors to enhance reference error tolerance of the ADC.

13. The method of claim 11, wherein the capacitor DAC comprises most significant bit (MSB) and MSB-1 capacitors and wherein the capacitor values are decreased to be non-binary weighted format.

14. The method of claim 11, wherein the capacitor DAC comprises MSB and MSB-1 capacitors and wherein a reduction of MSB and MSB-1 capacitor value is distributed and added back onto lower bit capacitors to maintain the same total capacitor DAC value.

15. The method of claim 11, wherein the capacitor DAC comprises MSB and MSB-1 capacitors and wherein two extra capacitors are added after LSB capacitor and the reduction of MSB and MSB-1 capacitor value is re-distributed onto lower bit capacitors.

16. The method of claim 11, comprising adding extra capacitors after an LSB capacitor and maintaining the same total capacitor value to enhance the reference accuracy tolerance and allow errors during SAR binary search process.

17. The method of claim 11, comprising increasing capacitor DAC resolution to introduce redundancy and relax a reference accuracy requirement for achieving higher ADC conversion rate.

18. The method of claim 11, comprising combining binary search logic outputs and processed to produce final binary outputs of the SAR ADC.

19. The method of claim 11, comprising adding extra bits that introduces redundancy and increases the tolerance of reference accuracy and reduces error during a binary search.

20. The SAR ADC of claim 1, comprising shifting and re-distributing the MSB and MSB-1 capacitors to lower bit capacitors so that the largest capacitance of DAC is decreased and an associated time constant is reduced.

* * * * *